United States Patent [19]

Nenyei et al.

[11] Patent Number: 5,580,830
[45] Date of Patent: Dec. 3, 1996

[54] MODIFIED REACTION CHAMBER AND IMPROVED GAS FLUSHING METHOD IN RAPID THERMAL PROCESSING APPARATUS

[75] Inventors: Zsolt Nenyei, Blaustein; Helmut Merkle, Dornstadt; Andreas Tillmann, Neu Ulm Pfuhl, all of Germany

[73] Assignee: AST Elekronik, Kircheim, Germany

[21] Appl. No.: 387,220

[22] Filed: Feb. 13, 1995

[30] Foreign Application Priority Data

Mar. 5, 1994 [DE] Germany ............. 44 07 377.1

[51] Int. Cl.⁶ ................................. H01L 71/324
[52] U.S. Cl. ................. 437/247; 437/248; 219/390
[58] Field of Search ......................... 437/247, 248, 437/10, 225; 118/715, 725, 724; 392/416, 418; 219/404, 390

[56] References Cited

U.S. PATENT DOCUMENTS

| | | | |
|---|---|---|---|
| 4,573,431 | 3/1986 | Sarkozy | 219/390 |
| 5,001,327 | 3/1991 | Hirasawa et al. | 219/390 |
| 5,228,206 | 7/1993 | Grant et al. | 392/418 |
| 5,259,883 | 11/1993 | Yamabe et al. | 219/390 |
| 5,433,368 | 7/1995 | Spigarelli | 219/390 |
| 5,434,090 | 7/1995 | Chiou et al. | 219/390 |

FOREIGN PATENT DOCUMENTS

| | | |
|---|---|---|
| 55-77145 | 6/1980 | Japan . |
| 61-129834 | 6/1986 | Japan . |
| 61-150224 | 7/1986 | Japan . |
| 1-321638 | 12/1989 | Japan . |

*Primary Examiner*—Kevin M. Picardat
*Attorney, Agent, or Firm*—Rodney T. Hodgson, Ph.D.

[57] ABSTRACT

A reaction chamber for a Rapid Thermal Processing (RTP) system contains an aperture to allow introduction and removal of the object to be processed. The cross sectional area of the aperture is significantly less than the cross sectional area of the reaction chamber. A method of flushing the reaction chamber, using a short time laminar flow of the flush gas, is used in combination with the aperture to increase the throughput of the RTP system.

23 Claims, 1 Drawing Sheet

MODIFIED REACTION CHAMBER AND IMPROVED GAS FLUSHING METHOD IN RAPID THERMAL PROCESSING APPARATUS

BACKGROUND OF THE INVENTION

1. Field of the invention.

The present invention relates to an apparatus and a method for increasing the throughput of a rapid thermal processing system. More specifically, the present invention discloses a chamber with an entry aperture of reduced area for an object to be processed, and a method of gas flushing a rapid thermal processing heating chamber which allows a shorter time for flushing between the time the object has been introduced into the chamber and the door closed and the time the heating of the object starts. The reduced aperture and a specific set of steps for flushing the chamber with a gas, most importantly a reduced time for a preliminary flushing step using a gas flow with a flow rate which is low enough that the flow is laminar, increase the throughput of the system and decrease the process gas consumption.

2. Description of the prior art.

Rapid Thermal Processing (RTP) is a versatile optical heating method which can be used for semiconductor processing as well as a general, well controlled, method for heating objects or wafers which are in the form of thin sheets, slabs, or disks. The objects are inserted into a chamber which has at least some portions of the chamber walls transparent to transmit light from powerful heating lamps. The light from the lamps is directed through the transparent portions of the walls on to the surface of the object to be heated. As long as the objects absorb light in the infrared or visible spectral region, RTP techniques allow fast changes in the temperature and process gas for the different material processes and conditions. RTP allows the "thermal budgets" of the various semiconductor processing to be reduced, as well as allows the production of various meta-stable states which can be "frozen in" when the material is cooled rapidly.

RTP systems are relatively new. In the last 10 or 15 years, such systems were used only in research and development. The thrust of the work was increasing the temperature uniformity, and developing heating cycles and processes which decreased the thermal budget. However, now that the systems are to be used in manufacturing, the issue of throughput becomes much more important. Higher heating powers, faster material handling, and more effective cooling of the material are now the major problems of interest.

A factory requires that only about 90–180 seconds are spent on each wafer in an RTP system. Of this time, the times for heating and cooling and dwell times are specified by the process technology and can not be changed. One of the places to save time is the step necessary in most processes where the RTP chamber is pre-flushed after the wafer is introduced and the door closed. This pre-flushing step is necessary to remove atmospheric impurities which enter the chamber each time the door is opened. When titanium or cobalt is deposited on the wafer and rapidly heated to form titanium or cobalt silicide, for example, traces of oxygen will react with the metals and ruin the process. Nitrogen or another inert process gas is generally introduced into the chamber to prevent this. The shortest time that has been heretofore used in a commercial RTP reactor for pre-flushing with the process gas was 30 seconds. This time could only be reached with very good gas distribution in the chamber and a relatively high flushing rate.

Most RTP machines have a thin rectangular quartz reaction chamber having one end open as sketched in FIG. 1. Chambers meant for vacuum use often have a flattened oval cross section. Chambers could even be made in the form of a flat cylindrical pancake. In general, the chambers are used so that the thin objects to be heated are held horizontally, but they could also be held vertically. The reactor chamber is usually as thin as possible to bring the lamps as close as possible to the object to be heated. The reactor chamber is opened and closed at one end with a pneumatically operated door when the wafer handling system is in operation. The door is usually made of stainless steel, and may have a quartz plate attached to the inside. The process gas is introduced into the chamber on the side opposite the door and exhausted on the door side. The process gas flow is controlled by computer controlled valves connected to various manifolds in a manner well known in the art.

All reactors based on this principle have the entire cross section of one end of the reactor chamber open during the wafer handling process. This construction has been established because the various wafer holders, silicon rings, and gas distribution plates, which are significantly bigger and may be thicker than the wafers, must also be introduced into the chamber and must be easily and quickly changed when the process is changed or when different wafer sizes, for example, are used. The reaction chamber dimensions are designed with these ancillary pieces in mind.

We have recognized that each time the warm chamber is opened a horizontal chimney effect is established. The warm gas exits from the chamber in a flow that is concentrated at the top of the chamber. The exit velocity of the gas is higher, and by the Bernoulli principle the lowered pressure pulls in cold gas from the outside in a flow along the lower part of the chamber. This impurity source in the chamber is the origin of the heretofore necessary long preliminary flushing time.

After the object to be processed has been introduced into the chamber and the door closed, the impurities are concentrated near the door. Prior art methods of flushing used high flow rates, so that the flow "bounced off" the door and back into the chamber so that the impurities were uniformly distributed throughout the chamber. The time taken to dilute the impurities to an acceptable level is then quite long, and the flow rates of process gas required were quite high.

SUMMARY OF THE INVENTION

The reaction chamber of a rapid thermal processing system contains an aperture which may be closed off and opened to allow introduction and removal of the object to be processed. The cross sectional area of the aperture is significantly less than the cross sectional area of the reaction chamber. When the device closing the aperture is opened to remove the processed object, significantly less outside gas is introduced into the chamber. When the next object to be processed is introduced into the chamber, a laminar preliminary flushing flow of process gas can remove the gas impurity which is concentrated near the aperture. After a short preliminary laminar flow, the flow rate is raised to produce turbulent flow which distributes the remaining impurity uniformly throughout the chamber and dilutes it further.

DETAILED DESCRIPTION OF THE INVENTION

Figure 3:
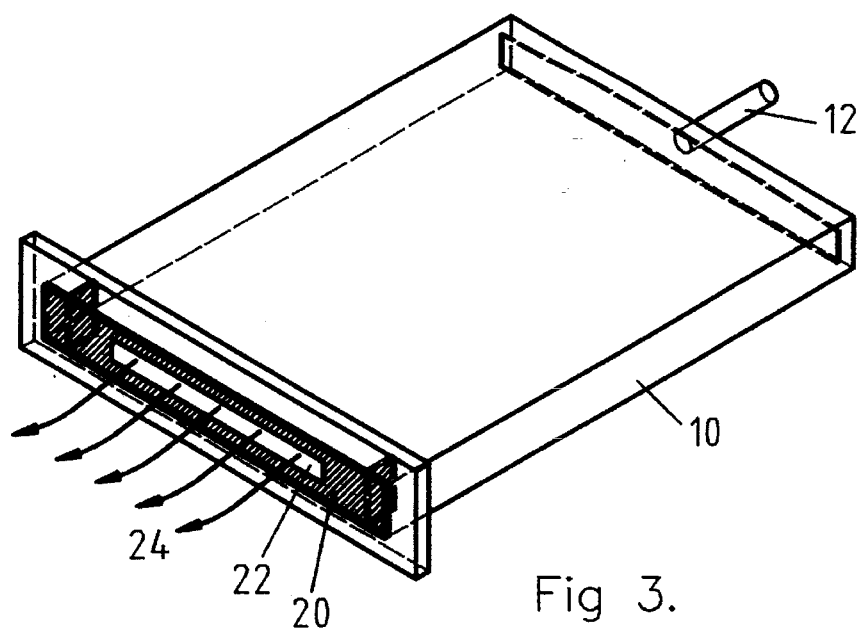
FIG. 3 is a sketch of the plate containing the restricted aperture of the present invention inserted into the open end of the conventional open ended quartz reactor chamber of an RTP system and showing the exit flow of the warm gases.

The realization and visualization of the flow pattern in the warm prior art RTP chamber when the door is open prompts part of the solution. A chamber having an aperture with a smaller cross sectional area than the cross sectional area of the chamber allows a higher pressure in the chamber for the same flow rate. The higher pressure keeps the inflow of outside gas substantially smaller than in prior art apparatus. The restricted aperture can be designed as an aperture in a movable plate placed adjacent the chamber in an RTP system, as an aperture in the conventional door in an RTP system, or preferably as an aperture in a plate inserted into the chamber of an RTP system as shown in FIG. 3. Alternatively, the chamber can be permanently modified with a restricted area aperture by welding material on the side of the chamber or by other techniques known in the art. In the case that the aperture is permanently connected to the chamber, another side of the chamber must be modified so that the various parts larger than the normal objects to be heated may be introduced.

Figure 1:
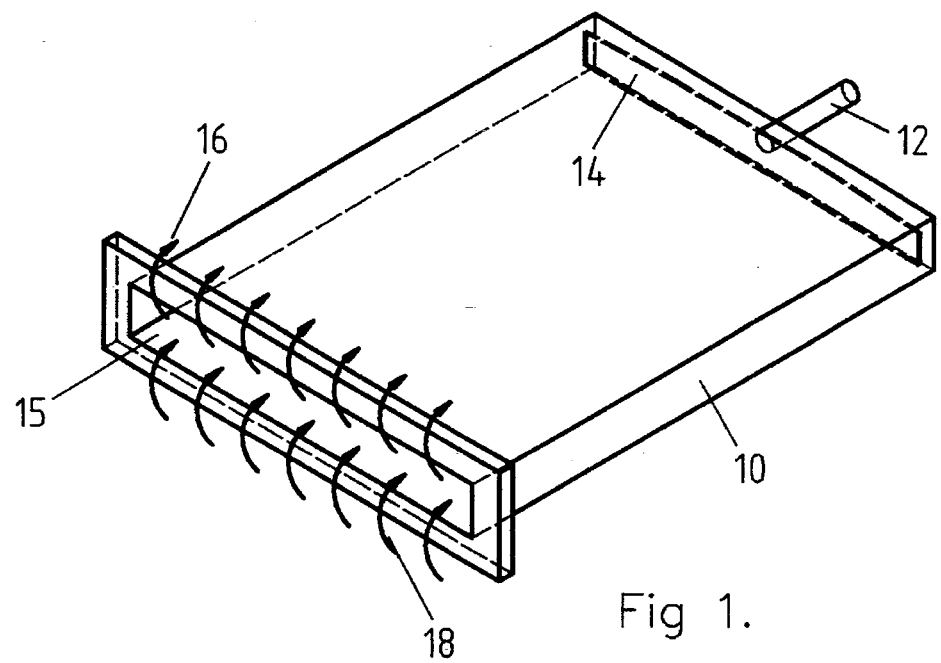
FIG. 1 is a sketch of the prior art conventional open ended quartz reactor chamber for an RTP system showing the door removed and the gas flow from the warm reactor chamber.

The prior art open quartz RTP reactor is shown in FIG. 1. The reaction chamber 10 has a gas inlet 12 and a gas distribution system 14. The outflow of warm flushing gas through the opening 15 in the reactor chamber 10 is denoted by the arrows 16, while the inflow of the cool outside atmosphere is denoted by arrows 18.

Figure 2:
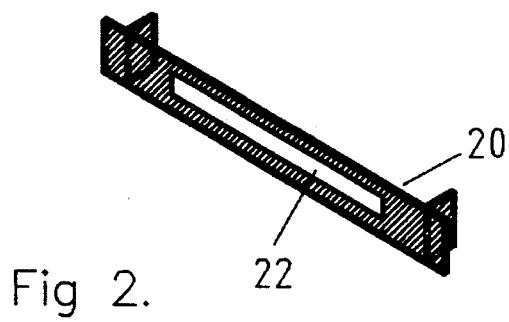
FIG. 2 is a sketch of a plate containing the restricted aperture of the present invention.

FIG. 2 shows an insert 20 which can be inserted into opening 15 in the reactor chamber 10. The insert 20 has a restricted aperture 22 which has significantly less cross sectional area than the cross sectional area of the reactor chamber 10. The aperture 22 has a cross sectional area preferably less than 75% of the cross sectional area of the reaction chamber 10, more preferably less than about 50% of the cross sectional area of the reaction chamber 10, and most preferably less than about 25% of the cross sectional area of the reaction chamber 10. The insert can be made of quartz, silicon, polysilicon, silicon carbide, or any number of like materials.

FIG. 3 shows the insert 20 inserted into and closing off the opening 15 in the reaction chamber 10. The gas flow 24 through the aperture 22 now substantially flows out of the chamber when the chamber is warm. After a new object to be heated is inserted into chamber 10 through the aperture 22 in the insert 20, the aperture 22 is closed off by a door (not shown) and the gas flow rate is adjusted so that the gas flow in the chamber is laminar flow. The impurities introduced into the chamber are concentrated near the aperture, and the laminar flow ensures that there is little backflow of the impurities to the back of the chamber. The impurities are then flushed out more efficiently. After a short time which depends on the flow rate and the volume of the chamber, but is preferably less than 20 seconds, more preferably less than 10 seconds, and most preferably less than about 5 seconds, the rate of flow is raised until the flow of flushing gas in the chamber is turbulent. This turbulent flow distributes the remaining impurity uniformly through the chamber, and dilutes it with fresh flushing gas. The turbulent gas flow is allowed to run for a time sufficient to bring the impurity level to the desired level, preferably less than 20 seconds, more preferably less than 10 seconds, and most preferably less than about 5 seconds. A laminar flow alone would clear the impurities from the chamber, but the laminar flow would take much longer than the combination of a short time laminar flow and a short time turbulent flow.

The combination of the short time laminar flow followed by a short time turbulent flow works well in a conventional thin RTP reactor. The restricted aperture also reduces the impurity concentration and the time needed to bring the chamber to the necessary low impurity concentration level when used by itself.

The analysis of the gas flow in the RTP chamber is a complex problem. The results are strongly influenced by the geometric measurements of the chamber, the ancillary objects in the chamber, and the object to be heated in the chamber. The rapid heating and cooling of the heated object and the inhomogeneous temperature profile of the surroundings are also important. The water cooled door used to block off the opening in the reactor or the aperture in the insert produces an effect on the temperature distribution of the object to be heated which must be accounted for. The process gas is also cooled at the cooled door, which sets up a circulation in the chamber and cools the wafer more strongly near the door. The insert also reduces these effects and helps in the optimizing of the temperature homogeneity of the wafer during the heating process.

The following examples are given to illustrate the scope of the present invention. Since the examples are given for illustrative purposes only, the invention should not be limited thereto.

EXAMPLE 1

The chamber volume was about 2–2.5 liters. The cross sectional area of the end of the chamber was 300 mm×25 min. An insert with an aperture was used to reduce the cross sectional area to about 25% of the previously open area. 150 mm diameter wafers used. When the door closing the aperture was open, a flow rate of 15 standard liters per minute (slm) was used. After the wafer was introduced into the chamber and the door closed, the preliminary flushing steps were taken. Step 1: the flow rate was 3–4 slm for 5 seconds, step 2: then the flow rate was raised linearly from 3–4 slm to 15 slm in 5 seconds, finally, step 3: the flow rate was set at 20 slm for 5 sec. The wafer was then treated with the appropriate heating cycle and cooling cycle and removed, and the next wafer was introduced to repeat the cycle.

EXAMPLE 2

The same conditions as related for example 1 were used for a titanium silicide process. In this case, we found that we could use only step 1 for 5–10 seconds for satisfactory results.

We claim:

1. A reaction chamber for a Rapid Thermal Processing system comprising: a plurality of walls; at least a first wall having an area transparent to light; and at least a second wall containing an aperture for introducing and removing objects to be processed, the aperture serving as an exit for a flushing gas flow, the aperture having a cross sectional area less than 75% of the cross sectional area of the second wall.

2. The reaction chamber of claim 1 wherein the second wall containing the aperture is a door.

3. The reaction chamber of claim 1, further comprising: means for supplying light to the object to be processed; means for controlling the light supplied to the object to be processed; gas control means for supplying gas to the reaction chamber and; means for inserting the object to be processed through the aperture into the reaction chamber.

4. The apparatus of claim 1, wherein the aperture has a cross sectional area less than 50% of the cross sectional area of the second wall.

5. The apparatus of claim 4, wherein the aperture has a cross sectional area less than 25% of the cross sectional area of the second wall.

6. The reaction chamber of claim 1 wherein the second wall containing the aperture is a removable insert.

7. The reaction chamber of claim 6 wherein the removable insert containing the aperture is sealed by a door.

8. The reaction chamber of claim 6, further comprising: means for supplying light to the object to be processed; means for controlling the light supplied to the object to be processed; gas control means for supplying gas to the reaction chamber and; means for inserting the object to be processed through the aperture into the reaction chamber.

9. The apparatus of claim 6, wherein the aperture has a cross sectional area less than 50% of the cross sectional area of the second wall.

10. The apparatus of claim 9 wherein the aperture has a cross sectional area less than 25% of the cross sectional area of the second wall.

11. The reaction chamber of claim 1 wherein the second wall containing the aperture is fixedly connected to the reaction chamber.

12. The reaction chamber of claim 11, further comprising: means for supplying light to the object to be processed; means for controlling the light supplied to the object to be processed; gas control means for supplying gas to the reaction chamber and; means for inserting the object to be processed through the aperture into the reaction chamber.

13. A method for improving the throughput of a Rapid Thermal Processing system, comprising:
   a. insert having an aperture into a reaction chamber of the RTP system, the aperture having a cross sectional area less than 75% of the cross sectional area of the reaction chamber;
   b. inserting an object to be processed through the aperture in the insert into the reaction chamber; and
   c. flushing the reaction chamber with a flushing gas flow, the flushing gas flow being a laminar gas flow, the aperture serving as an exit for the flushing gas flow.

14. The method of claim 13; followed by the additional step d. flushing the reaction chamber with a flushing gas flow, the flushing gas flow being a turbulent flow.

15. The apparatus of claim 13, wherein the aperture has a cross sectional area less than 50% of the cross sectional area of the second wall.

16. The apparatus of claim 15, wherein the aperture has a cross sectional area less than 25% of the cross sectional area of the second wall.

17. A method for improving the throughput of a Rapid Thermal Processing system, comprising: a. inserting an object to be processed into a reaction chamber of the RTP system; b. flushing the reaction chamber with a first flushing gas flow for a first time, the first flushing gas flow being a laminar flow; and c. flushing the reaction chamber with a second flushing gas flow for a second time, the second flushing gas flow being a turbulent flow.

18. The method of claim 17, wherein the first time is less than 20 seconds.

19. The method of claim 18, wherein the first time is less than 5 seconds.

20. A method for improving the throughput of a Rapid Thermal Processing system having a reaction chamber with a plurality of walls, at least a first wall being transparent to light, comprising:
   a. inserting an object to be processed through an aperture in a second wall of a reaction chamber in an RTP system, the aperture having a cross sectional area less than 75% of the cross sectional area of the second wall; and
   b. flushing the reaction chamber with a first flushing gas flow for a first time, the first flushing gas flow being a laminar gas flow, the aperture serving as an exit for a flushing gas flow.

21. The method of claim 20; followed by the additional step c. flushing the reaction chamber with a second flushing gas flow for a second time, the second flushing gas flow being a turbulent flow.

22. The method of claim 20, wherein the first time is less than 20 seconds.

23. The method of claim 22, wherein the first time is less than 5 seconds.

* * * * *